(12) United States Patent
Kerness et al.

(10) Patent No.: US 9,322,901 B2
(45) Date of Patent: Apr. 26, 2016

(54) MULTICHIP WAFER LEVEL PACKAGE (WLP) OPTICAL DEVICE

(71) Applicant: Maxim Integrated Products, Inc., San Jose, CA (US)

(72) Inventors: Nicole D. Kerness, Menlo Park, CA (US); Joy T. Jones, Fremont, CA (US); Christopher F. Edwards, Sunnyvale, CA (US); Arkadii V. Samoilov, Saratoga, CA (US); Phillip J. Benzel, Pleasanton, CA (US); Richard I. Olsen, Truckee, CA (US); Peter R. Harper, Gilroy, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 150 days.

(21) Appl. No.: 14/141,611

(22) Filed: Dec. 27, 2013

(65) Prior Publication Data

US 2014/0231635 A1 Aug. 21, 2014

Related U.S. Application Data

(60) Provisional application No. 61/766,938, filed on Feb. 20, 2013, provisional application No. 61/775,849, filed on Mar. 11, 2013.

(51) Int. Cl.

| | |
|---|---|
| *G01S 17/00* | (2006.01) |
| *G01S 7/481* | (2006.01) |
| *H01L 31/0216* | (2014.01) |
| *H01L 31/0232* | (2014.01) |
| *H01L 31/173* | (2006.01) |
| *G01S 17/02* | (2006.01) |
| *G01S 17/58* | (2006.01) |

(52) U.S. Cl.
CPC ............ *G01S 7/4813* (2013.01); *G01S 17/026* (2013.01); *G01S 17/58* (2013.01); *H01L 31/02162* (2013.01); *H01L 31/02325* (2013.01); *H01L 31/173* (2013.01); *H01L 2224/16225* (2013.01)

(58) Field of Classification Search
CPC ..... G01S 7/4813; G01S 17/026; G01S 17/58; H01L 31/02325; H01L 31/02162
See application file for complete search history.

(56) References Cited

U.S. PATENT DOCUMENTS

| | | | | |
|---|---|---|---|---|
| 4,309,605 | A | * | 1/1982 | Okabe .......................... 250/239 |
| 5,266,794 | A | * | 11/1993 | Olbright et al. ......... 250/214 LS |
| 2010/0105882 | A1 | * | 4/2010 | Katayama et al. ............ 530/412 |

FOREIGN PATENT DOCUMENTS

| | | |
|---|---|---|
| CN | 201804913 U | 4/2011 |
| CN | 202067790 U | 12/2011 |

OTHER PUBLICATIONS

Dong Chen, Li Zhang, Ye Xie, Kh Tan, Cm Lai; A Study of Novel Wafer Level LED Package Based on TSV Technology; Electronic Packaging Technology and High Density Packaging, 2012 13th International Conference; pp. 1-4.

*Primary Examiner* — Tony Ko

(74) *Attorney, Agent, or Firm* — Advent, LLP

(57) ABSTRACT

Optical devices are described that integrate multiple heterogeneous components in a single, compact package. In one or more implementations, the optical devices include a carrier substrate having a surface that includes two or more cavities formed therein. One or more optical component devices are disposed within the respective cavities in a predetermined arrangement. A cover is disposed on the surface of the carrier substrate so that the cover at least substantially encloses the optical component devices within their respective cavities. The cover, which may be glass, is configured to transmit light within the predetermined spectrum of wavelengths.

26 Claims, 3 Drawing Sheets

MULTICHIP WAFER LEVEL PACKAGE (WLP) OPTICAL DEVICE

CROSS-REFERENCE TO RELATED APPLICATIONS

The present application claims the benefit under 35 U.S.C. §119(e) of U.S. Provisional Application Ser. No. 61/766,938, entitled MULTICHIP WAFER LEVEL PACKAGE (WLP) OPTICAL DEVICE, filed Feb. 20, 2013, and U.S. Provisional Application Ser. No. 61/775,849, entitled MULTICHIP WAFER LEVEL PACKAGE (WLP) OPTICAL DEVICE, filed Mar. 11, 2013. U.S. Provisional Application Ser. Nos. 61/766,938 and 61/775,849 are hereby incorporated by reference in their entirety.

BACKGROUND

Electronic devices, such as smart phones, tablet devices, laptop and desk top computers, digital media players, and so forth, increasingly employ optical devices to control the manipulation of a variety of functions provided by the device. For example, light sensors are commonly used by electronic devices to detect ambient lighting conditions in order to control the brightness of the device's display screen and the keyboard. Typical optical devices utilize sensors that employ photodetectors such as photodiodes, phototransistors, or the like, which convert received light into an electrical signal (e.g., a current or voltage, analog or digital).

Optical devices are commonly used in gesture or proximity sensing. Gesture sensing enables the detection of physical movement largely parallel to the display surface (e.g., "gestures") without the user actually touching the device within which the gesture sensing device resides. Proximity sensing enables the detection of physical movement that is largely perpendicular to the display surface (e.g., proximate to the display surface). The detected movements can be subsequently used as input command for the device. In implementations, the electronic device is programmed to recognize distinct non-contact hand motions, such as left-to-right, right-to-left, up-to-down, down-to-up, in-to-out, out-to-in, and so forth. Gesture and proximity sensing have found popular use in handheld electronic devices such as tablet computing devices and smart phones, as well as other portable electronic devices such as laptop computers, video game consoles, and so forth.

SUMMARY

Optical devices are described that integrate multiple heterogeneous components in a single, compact package. In one or more implementations, the optical devices include a carrier substrate having a surface that includes two or more cavities formed therein. One or more optical component devices are disposed within the respective cavities in a predetermined arrangement. For example, a light source may be disposed in a first cavity of the substrate. The light source is configured to emit light in a predetermined spectrum of wavelengths. Similarly, a sensor may be disposed in a second cavity of the substrate. The sensor is configured to detect light in the predetermined spectrum of wavelengths and to provide a signal in response thereto. A cover is disposed on the surface of the carrier substrate so that the cover at least substantially encloses the optical component devices within their respective cavities (e.g., the light source within the first cavity and the sensor within the second cavity). The cover, which may be glass, is configured to transmit light within the predetermined spectrum of wavelengths.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1:
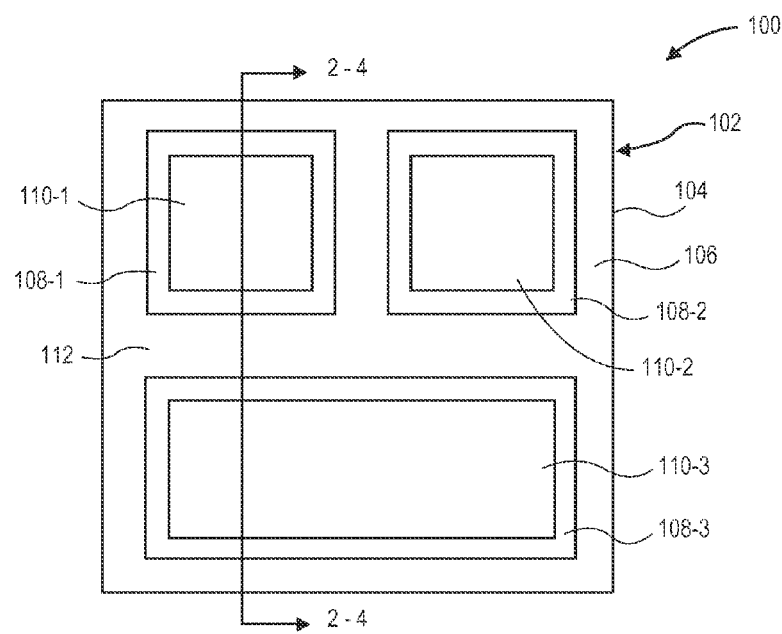
FIG. 1 is a diagrammatic top plan view illustrating a multichip wafer level package (WLP) optical device in accordance with an example embodiment of the present disclosure.

To furnish gesture and/or proximity sensing functionality, electronic devices have in the past employed discrete components such as light emitting diodes (e.g., an infrared light emitting diode (IR-LED)) and sensors (e.g., an IR light sensor, an integrated IR/ambient light sensor, etc.) that are separately packaged and mounted to a printed circuit board (PCB) of the device. This arrangement requires a relatively large amount of space on the printed circuit board. Moreover, to mitigate cross-talk between components (e.g., between a light emitting diode and an optical sensor), a physical barrier may be formed in the glass cover over the proximity sensor between the component packages or on the board itself. This physical barrier increases the amount of printed circuit board space used by the components.

Consequently, optical devices have been developed that integrate the light emitting diode and the light sensor assembly into single integrated packages that are mounted to the printed circuit board utilizing a conventional lead frame or a printed circuit board with a metal cap to support the device components (e.g., a light emitting diode and optical sensor). However, these integrated packages have large form factors due to constraints imposed by conventional packaging technologies. For example, the pre-molding process used with conventional lead frames requires relatively tall and wide cavity walls for mechanical strength and robustness. Similarly, integrated packages fabricated using a printed circuit board and metal cap tend to have an undesirably high profile or thickness. Further, none of the integrated packages facilitate mounting of a physical barrier to mitigate cross-talk between components of the optical device, and may be susceptible to contamination if exposed to the ambient environment.

Accordingly, optical devices are described that employ wafer level package (WLP) processing techniques to integrate multiple heterogeneous components in a single, compact package having a small footprint. The optical devices employ an optical package that comprises a carrier substrate having a surface that includes multiple cavities formed therein (e.g., at wafer level). One or more optical component devices such as light sources, sensors (e.g., optical sensors, light sensors, pyroelectric sensors, etc.), integrated circuit chips (e.g., analog front end (AFE), etc.), and so forth, are disposed within the respective cavities in a predetermined arrangement. For example, in embodiments, the optical package can include a light source, such as a light emitting diode (LED), laser diode, vertical cavity surface emitting laser (VCSEL), or the like, disposed in a first cavity of the substrate. As used herein, the term "light" is contemplated to encompass electromagnetic radiation occurring in the visible light spectrum and/or the near infrared light spectrum. The visible light spectrum (visible light) includes electromagnetic radiation occurring in the range of wavelengths from approximately three hundred and ninety nanometers (390 nm) to approximately seven hundred and fifty nanometers (750 nm). Similarly, the near infrared light spectrum (infrared light) includes electromagnetic radiation that ranges in wavelength from approximately seven hundred nanometers (700 nm) to approximately three microns (3 μm). In some embodiments, light may encompass electromagnetic radiation occurring in the ultraviolet (UV) light spectrum. Ultraviolet (UV) light includes electromagnetic radiation occurring in the range of wavelengths of approximately ten nanometers (10 nm) to approximately four hundred nanometers (400 nm).

The light source is configured to emit electromagnetic radiation in a predetermined spectrum of wavelengths (e.g., light). Similarly, a sensor such as an optical sensor, a light sensor, a pyroelectric sensor, and so forth, is disposed in a second cavity of the substrate generally adjacent to the first cavity. The sensor is configured to detect electromagnetic radiation in the predetermined spectrum of wavelengths and to provide a signal in response thereto. Electrical interconnection is provided to the optical component devices through backside connection techniques such as through-substrate-vias (TSV), redistribution structures, and so forth. For example, the carrier substrate may comprise TSVs to furnish electrical connection to the light source or the sensor or both. A cover is disposed on the surface of the carrier substrate so that the cover at least substantially encloses the component devices (e.g., the light source and sensor) within their respective cavities. The cover, which may be glass, is configured to transmit light within the predetermined spectrum of wavelengths.

The resulting optical devices may thus have a small footprint in comparison with conventional optical devices/assemblies. Moreover, the optical devices are more robust in humid and high temperature conditions. Additionally, the carrier substrate, which may be silicon, provides improved CTE (Coefficient of Thermal Expansion) matching with the optical component devices, which may be wafer level package (WLP) devices (employing dies fabricated of silicon).

In the following discussion, example implementations of light sensing devices having a lens are described.

Example Implementations

FIGS. 1 through 4 illustrate an optical device 100 in accordance with an example implementation of the present disclosure. As shown, the optical device 100 comprises a package 102 that includes a carrier substrate 104. In embodiments, the carrier substrate 104 may be fabricated of silicon (Si). For example, as shown in FIG. 5, the carrier substrate 104 may be fabricated in, and singulated (diced) from, a silicon wafer 50 using wafer level package (WLP) processing techniques. However, it is contemplated that the carrier substrate 104 may be fabricated via other processing techniques, utilizing other materials. The carrier substrate 104 includes a surface 106 having cavities 108 (three cavities 108-1, 108-2, 108-3 are illustrated) formed therein in a predetermined arrangement.

One or more optical component devices 110 (three optical component devices 110-1, 110-2, 110-3 are illustrated) are disposed within the respective cavities 108 (e.g., cavities 108-1, 108-2, 108-3). As shown, the cavities 108 may be sized and shaped so that the optical component devices 110 fit within the cavities 108, and to not extend beyond the surface 106 of the substrate 104. In FIG. 1, cavities 108 that are generally rectangular (e.g., rectangular or square) in cross-section are illustrated. However, it is contemplated that the cavities 108 may have cross-sections of different shapes (e.g., round, oval, polygonal, irregularly shaped, etc.) depending on design requirement. Additionally, the cavities 108 may have a profile (e.g., an internal shape (volume)) configured to contain the optical component device 110 which is to be mounted therein. For example, in FIGS. 2 through 4, the cavities 108 are illustrated as having sidewalls 108-4 that extend downwardly and then slope inward to a bottom surface 108-5. However, the sidewalls 108-4 of the cavities 108 are not necessarily limited to this configuration. For example, the sidewalls 108-4 of one or more of the cavities 108 may extend downward (without sloping) to the bottom surface 108-5, may slope continuously to the bottom surface 108, and so forth. Suitable wafer level package (WLP) processing techniques (e.g., wet etch, dry etch, combinations thereof, and so forth) may be used to form the cavities at wafer level so that sidewalls 108-4 and bottom surface 108-5 may have the desired profile.

It is contemplated that a variety of optical component devices 110 may be provided. Example optical component devices 110 include, but are not limited to: light sources such as light emitting diodes (LED), laser diodes, vertical cavity surface emitting laser (VCSEL), and so forth; sensors such as optical sensors, light sensors, pyroelectric sensors, and so forth; integrated circuit chips containing analog and/or digital components (e.g., an analog front end (AFE), etc.), or combinations thereof.

In the illustrated embodiments, light sources 110-1, 110-2, which may comprise light emitting diodes (LED), laser diodes, vertical cavity surface emitting laser (VCSEL), or the like, are disposed in cavities 108-1, 108-2 formed in the surface 106 of the substrate 104. The light sources 110-1, 110-2 are configured to emit electromagnetic radiation in a predetermined spectrum of wavelengths (e.g., light). A sensor 110-3 is disposed in a cavity 108-3 formed in the surface 106 of the substrate 104 generally adjacent to the cavities. The sensor 110-3, which may comprise an optical sensor, a light sensor, a pyroelectric sensor, or the like, is configured to detect electromagnetic radiation in the predetermined spectrum of wavelengths (e.g., light) and to provide a signal in response thereto. In this manner, the optical device 100 may be configured to furnish gesture detection or proximity detection functionality.

A cover 112 is disposed on the surface 106 of the carrier substrate 104 so that the cover 112 at least substantially encloses the component devices 110 (e.g., the light sources 110-1, 110-2 and sensor 110-3) within their respective cavities 108 (e.g., within cavities 108-1, 108-2, 108-3). In embodiments, the cover 112 is fabricated of glass. However, it is contemplated that the cover 112 may also comprise other materials that are transmissive of electromagnetic radiation within a desired spectrum of wavelengths (e.g., within a broader spectrum of wavelengths than the spectrum of wavelengths emitted by the light sources 110-1, 110-2; within a spectrum of wavelengths that is generally equivalent to the spectrum of wavelengths emitted by the light sources 110-1, 110-2; or within a narrower spectrum of wavelengths than the spectrum of wavelengths emitted by the light sources 110-1, 110-2, and so forth). The cover 112 may be attached to the surface 106 of the substrate using a suitable attachment technique, such as bonding, via an adhesive, and so forth. For example, the cover 110 may be fabricated from a glass wafer 52 (FIG. 5) that is attached (e.g., bonded or adhered) to the surface of the wafer 50 from which the carrier substrate is fabricated to form a wafer assembly, then singulated with the wafer assembly 54.

In embodiments, the cover 112 is configured to at least substantially allow for the passage of light through the cover 112. In an implementation, the cover 112 is configured to allow for sufficient passage of light through the cover 112. In one example, the cover 112 is configured to at least substantially allow for the passage of at least ninety percent (90%) of light through the cover 112. However, other percentages are contemplated. For example, the cover 112 may at least substantially pass through light that is reflected from an object proximate (e.g., above) to the sensor 110-3.

The cover 112 may include one or more lens assemblies 114 that are configured to condition (e.g., block, filter, focus, collimate, diffuse, etc.) electromagnetic radiation incident on the cover 112. In the illustrated embodiments, the lens assemblies 114 are shown as being indented into channels formed in an interior surface of the cover 112 adjacent to the surface 106 of the carrier substrate 104. However, depending upon the configuration of the sensor device 100, the lens assemblies 114 may be on either side of the cover 112, and/or may be attached to the interior surface or an exterior surface of the cover 112 instead of being indented into channels. By integrating the lens assemblies 114 into the cover 112 (e.g., integrating the lens assemblies 114 into channels formed in the glass from which the cover 112 is fabricated), the lens assemblies 114 can be aligned with the cavities 108 and optical component devices 110 (e.g., aligned with light sources 110-1, 110-2; or sensor 110-3). Moreover, in this manner, the cover 112 (e.g., glass) may be integrated into the cover glass of an electronic device, such as a smart phone, tablet computer, and so forth, employing the optical device 100.

Figure 2:
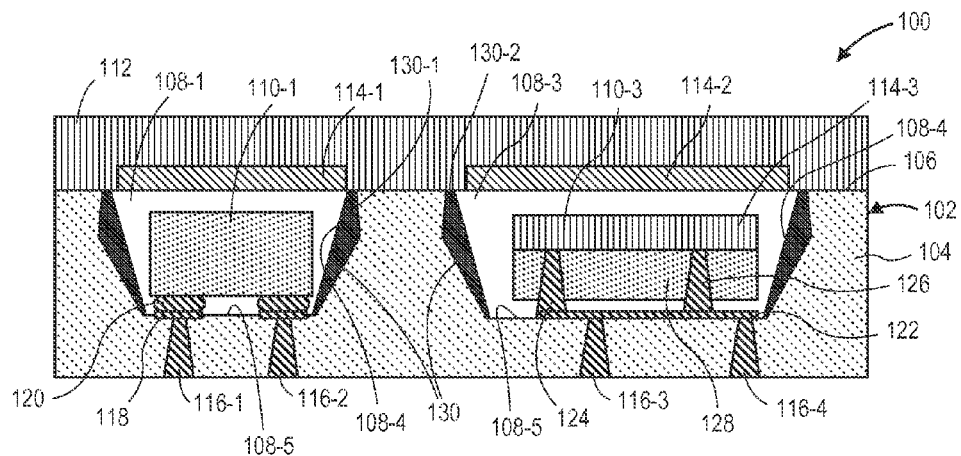
FIG. 2 is a diagrammatic partial cross-sectional view of the optical device shown in FIG. 1, taken along plane 2-2, further illustrating features of the optical device in accordance with an example embodiment of the disclosure.
Figure 3:
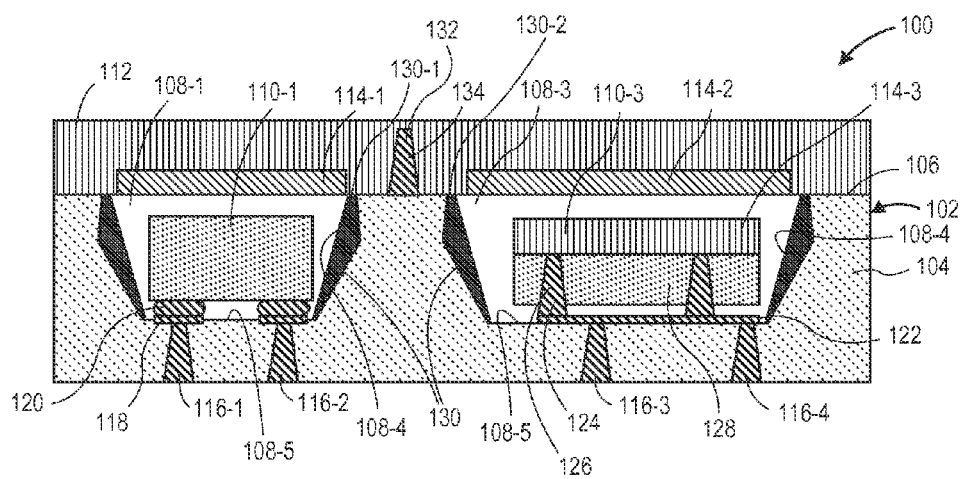
FIG. 3 is a diagrammatic partial cross-sectional view of the optical device shown in FIG. 1, taken along plane 3-3, further illustrating features of the optical device in accordance with an example embodiment of the disclosure.
Figure 4:
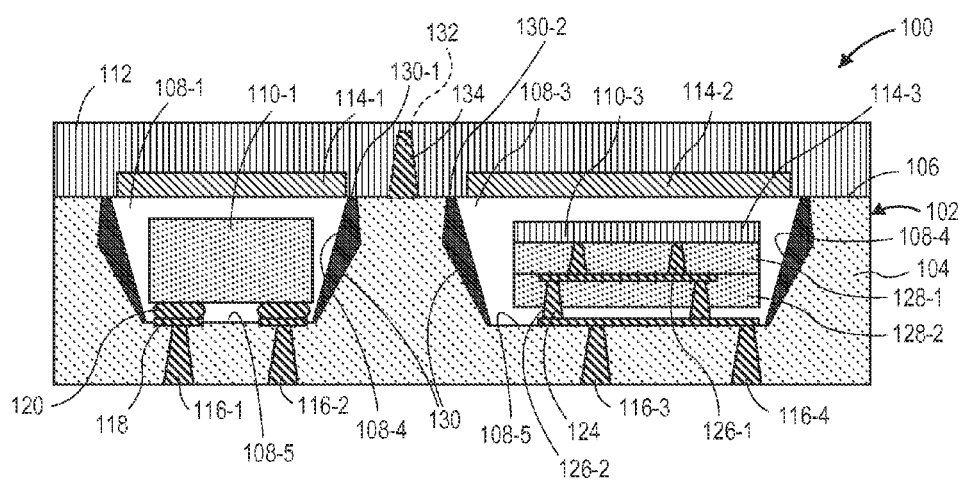
FIG. 4 is a diagrammatic partial cross-sectional view of the optical device shown in FIG. 1, taken along plane 4-4, further illustrating features of the optical device in accordance with an example embodiment of the disclosure.
Figure 5:
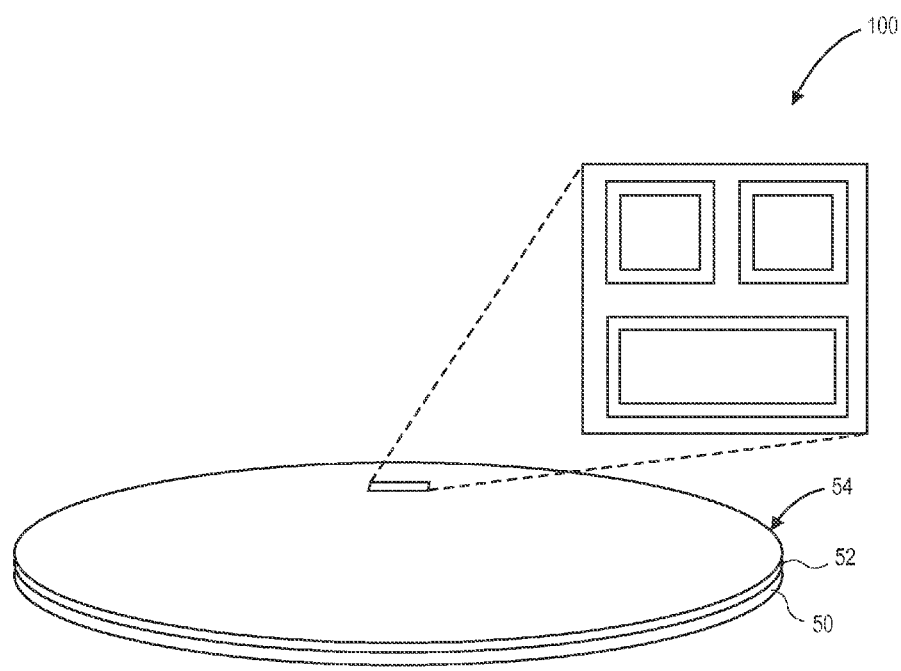
FIG. 5 is a diagrammatic exploded view illustrating a wafer utilized to fabricate the optical device shown in FIG. 1 in accordance with an example embodiment of the present disclosure.

In FIGS. 2 through 4, the cover 112 is illustrated as including a lens assembly 114-1 integrated into the cover 112 over cavity 108-1 to collimate light emitted by the light source 110-1 (a second lens assembly (not shown) may be integrated into the cover 112 over cavity 108-2 to collimate light emitted by the light source 110-2). Similarly, a lens assembly 114-2 is illustrated as integrated into the cover over cavity 108-3 to collimate light incident on the second lens assembly 114-2 and to pass the collimated light to the sensor 110-3. Additionally, lens assemblies 114 may be furnished on optical component devices 110 contained within the cavities. For example, as shown, sensor 110-3 may include a lens assembly 114-3 to condition (e.g., block, filter, focus, collimate, diffuse, etc.) electromagnetic radiation incident on the sensor 110-3.

The lens assemblies 114 may have a variety of configurations. For example, one or more of the lens assemblies 114 may comprise a lens configured to focus and to transmit light incident upon the cover 112 from multiple angles. The lens assemblies 114 may be configured as a Fresnel lens, a ball lens, a diffractive lens, a diffractive optics element (DOE) lens, a gradient-index (GRIN) optics lens, another type of lens, or the like, that is configured to collimate the light incident on the lens assembly 114. The lens assemblies 114 may include a diffuser in addition to or in place of a lens.

In embodiments, the lens assemblies may further comprise filters such as color pass filters, Infrared (IR) suppression filters, and so forth. Color pass filters are configured to filter visible light and to pass light in a limited spectrum of wavelengths (e.g., light having wavelengths between a first wavelength and a second wavelength). In embodiments, the color pass filters may comprise absorption filters that allow visible light in a limited spectrum of wavelengths to pass through the filter, while blocking (e.g., absorbing or reflecting) visible light within a second spectrum of wavelengths. Thus, a color pass filter may be substantially transparent for visible light within a first spectrum of wavelengths, and substantially opaque within a second spectrum of wavelengths. In other embodiments, the color pass filters may comprise an interference filter that allows visible light to pass in a specified range of wavelengths. IR suppression filters are configured to filter infrared light from light received by the light sensor to at least substantially block infrared light. For example, in specific implementations, IR suppression filters may be provided that are capable of blocking approximately fifty (50) to one hundred (100) percent of infrared light (i.e., light in the infrared spectrum) incident on the IR suppression filter while at least substantially passing (e.g., passing approximately greater than fifty (50) percent) visible light (i.e., light in the visible spectrum). However, the aforementioned values (e.g., percentage values representing the proportion of infrared light blocked and/or passed by the IR suppression filter) may depend on particular application requirements of the optical device 100. Thus, IR suppression filters that are capable of blocking a higher or lower proportion of infrared light and/or of transmitting a higher or lower proportion of visible light are contemplated.

Electrical interconnection is provided to the optical component devices 110 through backside connection techniques. For example, in the embodiments, the carrier substrate 104 comprises through-substrate-vias (TSV) 116 configured to furnish electrical connection to optical component devices 110 contained in the cavities 108 of the carrier substrate 104. As shown in FIGS. 2, 3, and 4, through-substrate-vias (TSV) 116-1, 116-2 extend through the carrier substrate 104 to corresponding contact pads 118 on the bottom surface 108-5 of cavity 108-1. The optical component device, light source 110-1, contained within the cavity 108-1, includes solder bumps 120 which electrically connect the device 110-1 with contact pads 118 and thus to the through-substrate-vias 116-1, 116-2 to furnish electrical connection (and optionally mechanical support) to the device 110-1. The optical component devices 110 may be adhered to the bottom surfaces 108-5 of the respective cavities 108 using a suitable adhesive such as benzocyclobutane (BCB) polymer. The cavities 108 of the carrier substrate 104 may include an underfill material (not shown) to mechanically support the optical component devices 110 within the cavities 108. For example, one or more of the cavities 108 may include an underfill material provided to the spaces between bottom surface 108-5 of the cavity 108 and the optical component devices 110 to mechanically support (e.g., stabilize) the optical component device 110 within the cavity 108.

Similarly, through-substrate-vias (TSV) 116-3, 116-4 extend through the carrier substrate 104 bottom surface 108-5 of cavity 108-3. A redistribution trace 122 on the bottom surface 108-5 of the cavity 108-3 furnishes electrical interconnection and routing between the through-substrate-vias (TSV) 116-3, 116-4 and electrical contacts 124 of the optical component device, sensor 110-3, contained within the cavity 108-3 (e.g., the electrical contacts may be connected to contact pads of the redistribution trace 122). In embodiments, the electrical contacts 124 may be formed by through-substrate-vias (TSV) 126 within the component device 110-3 to furnish electrical connection (and optionally mechanical support) to the device 110-1.

The through-substrate-vias (TSV) 116 may be formed in the carrier substrate 104 using a suitable wafer-level-packaging (WLP) processing technique. For example, in an embodiment, the wafer 50 from which the carrier substrate 104 is fabricated may be thinned. The through-substrate-vias (TSV) 116 may then be formed through the wafer from the bottom surfaces 108-5 of the cavities 108. In another embodiment, the through-substrate-vias (TSV) 116 may be formed in the wafer 50 from the back of the wafer 50 prior to formation of the cavities 108 in the wafer 50. The through-substrate-vias (TSV) 116 may be formed of a conductive material such as a metal (copper) or the like. Additionally, the through-substrate-vias (TSV) 116 may be solid (e.g., filled with conductive material (e.g., copper) or hollow (e.g., lined with conductive material (e.g., copper).

In embodiments, the optical component devices 110 (e.g., sensor 110-3) may comprise wafer level package (WLP) device die 128 having a glass substrate (e.g., a lens assembly 114-3) formed thereon. As shown in FIGS. 2, 3, and 4, the wafer level package die 128 comprises through-substrate-vias (TSV) 126 formed therein to facilitate connection of the device 110 (e.g. sensor 110-3) to the carrier substrate 104 within a respective cavity 108 as discussed above. Moreover, one or more optical component devices 110 may comprise stacked wafer level package (WLP) die 128. The stacked wafer level package (WLP) die may be configured to provide a variety of functionality (e.g., sensing (detection), signal processing, storage, etc.). For example, as shown in FIG. 4, the optical component device (sensor 110-3) may comprise a first wafer level package (WLP) die 128-1, such as a sensor die, attached to a second wafer level package (WLP) die 128-2, such as an integrated circuit, in a stacked arrangement. Through-substrate-vias (TSV) 126-1 formed in the first wafer level package (WLP) die 128-1 facilitate electrical connection of the first wafer level package die 128-1 to the second wafer level package die 128-2. Through-substrate-vias (TSV) 126-2 formed in the second wafer level package (WLP) die 128-2 similarly facilitate electrical connection of the second wafer level package die 128-2 (and/or the first wafer level package (WLP) die 128-1 through the second wafer level package (WLP) die 128-2 to the redistribution trace 122 as described herein. Additionally, it is contemplated that additional (e.g., three (3) or more) wafer level package (WLP) die 128 may be included in the stack and interconnected via through substrate vias (TSV) 126.

A reflective liner 130 is provided within one or more of the cavities 108. The reflective liners 130 are configured to reflect light within the cavities 108 and to inhibit (e.g., reduce or eliminate) crosstalk between optical component devices 110 contained within the cavities 108. For example, as shown in FIGS. 2, 3, and 4, cavity 108-1 includes a reflective liner 130-1 configured to reflect light emitted by the light source 110-1 (cavity 108-2 may likewise include a reflective liner 130 configured to reflect light emitted by the light source 110-2). Similarly, cavity 108-3 includes a reflective liner 130-2 configured to reflect light incident on the second cavity. In embodiments, the reflective liner 130 may be formed of a suitable metal, such as aluminum, formed on the sidewalls 108-4 (and/or bottom surface 108-5) of the cavities 108 using a suitable coating process (e.g., deposition processes, coating processes, sputtering processes, etc.) at wafer level.

In the embodiments illustrated in FIGS. 3 and 4, one or more optical baffles 132 may be provided between the cavities 108 to inhibit (e.g., reduce or eliminate) crosstalk between optical component devices 110 contained within the cavities 108. As shown, the optical baffles 132 extend from the surface 106 of the carrier substrate 104 into the cover 112 to block light transmitted directly through the cover 112 (and reflected by the outer surface of the cover 112) between the light source 110-1 contained in cavity 108-1 and the sensor 110-3 contained in cavity 108-3 (an optical baffle 132 may also be provided between cavity 108-2 and either or both of cavity 108-1 and cavity 108-3 to inhibit crosstalk between the optical component devices contained within those cavities 108). In this manner, the optical baffle 132 may function to prevent the transmission of crosstalk light from the light sources 110-1, 110-2 to the sensor 110-3 through the cover 112. In other embodiments, such as an optical waveguide, no barrier (e.g., optical baffle 132) is used, but the cover 112 is instead configured to reflect light from the light source(s) (e.g., light sources 110-1, 110-2) to the sensor(s) (e.g., sensor 110-3).

In one or more embodiments, the optical baffle 132, which may be fabricated at wafer level, may comprise a trench formed in the inner surface of the cover 112. The trench is at least partially filled with a light blocking (opaque) material 134 configured to block light in a predetermined spectrum of wavelengths (e.g., the spectrum of wavelengths emitted by the light sources 110-1, 110-2 and/or sensed by the sensor 110-3). Example light blocking materials include metal (e.g., aluminum)), and so forth.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:
1. An optical device comprising:
   a carrier substrate having a surface, the surface including at least a first cavity and a second cavity formed therein;
   a light source disposed in the first cavity, the light source configured to emit light in a predetermined spectrum of wavelengths;
   an optical sensor disposed in the second cavity, the optical sensor configured to detect light in the predetermined spectrum of wavelengths and to provide a signal in response thereto, the optical sensor including a wafer level package device die having a glass substrate formed thereon; and
   a cover disposed on the surface of the carrier substrate so that the cover at least substantially encloses the light source within the first cavity and the optical sensor within the second cavity, the cover configured to transmit light within the predetermined spectrum of wavelengths.

2. The optical device as recited in claim 1, wherein the cover comprises at least one of a first lens assembly disposed over the first cavity to collimate light emitted by the light source or a second lens assembly disposed over the second cavity to collimate light incident on the second lens assembly and to pass the collimated light to the optical sensor.

3. The optical device as recited in claim 1, wherein the carrier substrate comprises at least one through-substrate-via (TSV), the through-substrate-via extending from one of the first cavity or the second cavity through the carrier substrate to furnish electrical connection to the light source or the optical sensor.

4. The optical device as recited in claim 3, further comprising a redistribution trace disposed within at least one of the first cavity or the second cavity, the redistribution trace configured to furnish electrical connection between the light source or the optical sensor and the through-substrate-via.

5. The optical device as recited in claim 1, further comprising at least one of a first reflective liner disposed within the first cavity, the first reflective liner configured to reflect light emitted by the light source, or a second reflective liner disposed within the second cavity, the second reflective liner configured to reflect light incident on the second cavity.

6. The optical device as recited in claim 1, wherein the cover is configured to at least partially reflect light from the light source to the optical sensor as an optical waveguide.

7. The optical device as recited in claim 1, wherein the light source comprises a light emitting diode (LED) or a vertical cavity surface emitting laser (VCSEL).

8. The optical device as recited in claim 1, wherein the wafer level package die comprises a through-substrate-via (TSV) formed therein to facilitate connection of the optical sensor to the carrier substrate.

9. The optical device as recited in claim 1, wherein the cover comprises glass.

10. An optical device comprising:
a carrier substrate having a surface, the surface including at least a first cavity and a second cavity formed therein;
a light source disposed in the first cavity, the light source configured to emit light in a predetermined spectrum of wavelengths;
a sensor disposed in the second cavity, the sensor configured to detect light in the predetermined spectrum of wavelengths and to provide a signal in response thereto;
a cover disposed on the surface of the carrier substrate so that the cover at least substantially encloses the light source within the first cavity and the sensor within the second cavity, the cover configured to transmit light within the predetermined spectrum of wavelengths; and
an optical baffle disposed between the first cavity and the second cavity and extending from the surface of the carrier substrate into the cover, the optical baffle configured to at least substantially prevent the transmission of crosstalk light from the light source to the sensor through the cover, wherein the optical baffle comprises a trench formed in the cover to receive light blocking material, the light blocking material configured to block light in the predetermined spectrum of wavelengths.

11. An optical device comprising:
a carrier substrate having a surface, the surface including at least a first cavity and a second cavity formed therein;
a light source disposed in the first cavity, the light source configured to emit light in a predetermined spectrum of wavelengths;
an optical sensor disposed in the second cavity, the optical sensor configured to detect light in the predetermined spectrum of wavelengths and to provide a signal in response thereto, the optical sensor including a wafer level package device die having a glass substrate formed thereon;
a glass cover disposed on the surface of the carrier substrate so that the cover at least substantially encloses the light source within the first cavity and the optical sensor within the second cavity, the glass cover configured to transmit light within the predetermined spectrum of wavelengths;
a first lens assembly disposed in the glass cover over the first cavity to collimate light emitted by the light source;
a second lens assembly disposed in the glass cover over the second cavity to collimate light incident on the second lens assembly and to pass the collimated light to the optical sensor; and
at least one through-substrate-via (TSV) disposed in the carrier substrate, the through-substrate-via extending from one of the first cavity or the second cavity through the carrier substrate to furnish electrical connection to at least one of the light source or the optical sensor.

12. The optical device as recited in claim 11, further comprising at least one of a first reflective liner disposed within the first cavity, the first reflective liner configured to reflect light emitted by the light source, or a second reflective liner disposed within the second cavity, the second reflective liner configured to reflect light incident on the second cavity.

13. The optical device as recited in claim 11, further comprising a redistribution trace disposed within at least one of the first cavity or the second cavity, the redistribution trace configured to furnish electrical connection between the light source or the optical sensor and the through-substrate-via.

14. The optical device as recited in claim 11, wherein the light source comprises a light emitting diode (LED).

15. The optical device as recited in claim 11, wherein the wafer level package die comprises a through-substrate-via (TSV) formed therein to facilitate electrical connection of the wafer level package die.

16. The optical device as recited in claim 15, further comprising a second wafer level package die, the wafer level package die attached to the second wafer level package die in a stacked arrangement, wherein the through-substrate-via (TSV) is configured to facilitate electrical connection of the wafer level package die to the second wafer level package die.

17. An optical device comprising:
a carrier substrate having a surface, the surface including at least a first cavity and a second cavity formed therein;
a light source disposed in the first cavity, the light source configured to emit light in a predetermined spectrum of wavelengths;
a sensor disposed in the second cavity, the sensor configured to detect light in the predetermined spectrum of wavelengths and to provide a signal in response thereto;
a glass cover disposed on the surface of the carrier substrate so that the cover at least substantially encloses the light source within the first cavity and the sensor within the second cavity, the glass cover configured to transmit light within the predetermined spectrum of wavelengths;
a first lens assembly disposed in the glass cover over the first cavity to collimate light emitted by the light source;
a second lens assembly disposed in the glass cover over the second cavity to collimate light incident on the second lens assembly and to pass the collimated light to the sensor;
at least one through-substrate-via (TSV) disposed in the carrier substrate, the through-substrate-via extending from one of the first cavity or the second cavity through the carrier substrate to furnish electrical connection to at least one of the light source or the sensor; and an optical baffle disposed between the first cavity and the second cavity and extending from the surface of the carrier substrate into the cover, the optical baffle configured to at least substantially prevent the transmission of crosstalk light from the light source to the sensor through the cover, wherein the optical baffle comprises a trench formed in the glass cover to receive light blocking material, the light blocking material configured to block light in the predetermined spectrum of wavelengths.

18. A method for fabricating an optical device comprising:

forming a plurality of first cavities and a plurality of second cavities in a surface of a wafer;

mounting a light source in respective ones of the plurality of first cavities, the light source configured to emit light in a predetermined spectrum of wavelengths;

mounting a sensor in respective ones of the plurality of second cavities, the sensor configured to detect light in the predetermined spectrum of wavelengths and to provide a signal in response thereto;

attaching a cover to the wafer so that the cover at least substantially encloses the light source within the first cavity and the sensor within the second cavity, the cover configured to transmit light within the predetermined spectrum of wavelengths;

forming at least one through-substrate-via (TSV) in the wafer, the through-substrate-via extending from one of the first cavity or the second cavity through the wafer to furnish electrical connection to at least one of the light source or the sensor; and singulating the wafer and cover attached thereto to form an optical device, the optical device comprising at least one first cavity having a light source disposed therein, at least one second cavity having a sensor disposed therein, and at least one through-substrate-via.

19. The method as recited in claim 18, further comprising disposing a plurality of first lens assemblies and a plurality of second lens assemblies in the cover so that respective ones of the plurality of first lens assemblies are disposed over respective ones of the plurality of first cavities and the respective ones of the plurality of second lens assemblies are disposed over respective ones of the plurality of second cavities when the cover is attached to the wafer.

20. The method as recited in claim 18, further comprising forming a redistribution trace within at least one of the first cavity and the second cavity, the redistribution trace configured to furnish electrical connection between the light source or the sensor and the through-substrate-via.

21. The method as recited in claim 18, further comprising forming at least one of a first reflective liner within the first cavity, the first reflective liner configured to reflect light emitted by the light source, or a second reflective liner within the second cavity, the second reflective liner configured to reflect light incident on the second cavity.

22. The method as recited in claim 18, further comprising forming an optical baffle between the first cavity and the second cavity and extending from the surface of the wafer into the cover, the optical baffle configured to at least substantially prevent the transmission of crosstalk light from the light source to the sensor through the cover.

23. The method as recited in claim 22, wherein the forming of the optical baffle comprises forming a trench in the cover and depositing light blocking material within the trench, the light blocking material configured to block light in the predetermined spectrum of wavelengths.

24. The method as recited in claim 18, wherein the light source comprises a light emitting diode (LED).

25. The method as recited in claim 18, wherein the sensor comprises an optical sensor.

26. The method as recited in claim 18, wherein the cover comprises glass.

* * * * *